United States Patent [19]

Blum et al.

[11] 4,295,220
[45] Oct. 13, 1981

[54] CLOCK CHECK CIRCUITS USING DELAYED SIGNALS

[75] Inventors: Arnold Blum, Gechingen; Hellmuth R. Geng, Herrenberg; Hermann Schulze-Schoelling, Gaertringen; Bernd Spaeth, Stuttgart, all of Fed. Rep. of Germany

[73] Assignee: International Business Machines Corporation, Armonk, N.Y.

[21] Appl. No.: 98,587

[22] Filed: Nov. 29, 1979

[30] Foreign Application Priority Data

Dec. 12, 1978 [DE]  Fed. Rep. of Germany ....... 2853546

[51] Int. Cl.$^3$ .......................... H03K 5/19; G06F 1/04
[52] U.S. Cl. ....................................... 371/61; 364/200
[58] Field of Search ....................................... 371/61; 364/200 MS File, 900 MS File; 375/106

[56] References Cited

U.S. PATENT DOCUMENTS

| | | | |
|---|---|---|---|
| 3,602,900 | 8/1971 | Viroflay et al. | 364/200 |
| 3,803,568 | 4/1974 | Higashide | 371/61 X |
| 3,866,184 | 2/1975 | Buhrke et al. | 364/200 |
| 3,932,847 | 1/1976 | Smith | 364/200 |
| 4,144,448 | 3/1979 | Pisciotta | 371/61 |

OTHER PUBLICATIONS

Brown et al, "Checking Digital System Clock Pulses", IBM Tech. Disclosure Bulletin, vol. 11, No. 3, Aug. 1968, pp. 257–258.

*Primary Examiner*—David H. Malzahn
*Attorney, Agent, or Firm*—Saul A. Seinberg

[57] ABSTRACT

In a data processing or transmission system which includes at least two synchronized clocks, for example—T-rings A and B which generate timing pulses Tai and Tbi for microinstruction execution, synchronism is checked by logic circuitry which receives pulses from the clocks. At least one of the pulses is delayed by one or more pulse period durations ti. The logic circuit output signal is used as an input to an indicator latch which is periodically set by an independent check oscillator or clock. In a preferred embodiment, the delays are introduced by master-slave flip-flops, which receive predetermined combinations of the T-signals and set by the independent check clock.

Several delay latches and associated AND gates may be used for different logical combinations of delayed and undelayed T-signals. This scheme can easily be expanded to accommodate more than two synchronously operating clocks. These circuits check not only the instantaneous synchronism of the clocks, but also the correct sequencing of clock pulses. The check is also feasible if the T-ring counters are operated with a variable number of clock pulses per microinstruction execution.

15 Claims, 3 Drawing Figures

CLOCK CHECK CIRCUITS USING DELAYED SIGNALS

BACKGROUND OF INVENTION

1. Field of the Invention

This invention relates to circuitry for checking the synchronization of clocks employed in data processing and transmission systems and, more particularly, to checking synchronization through the utilization of appropriately delayed signals.

2. Description of the Prior Art

In complex systems for data processing and transmission, e.g.—telephone networks and computer systems, several synchronized clocks are frequently used. They either control various sub-systems, being at a considerable distance from each other, or they act as a reserve for taking over control of the system should there be a failure of the main clock. In either of these cases, it is critically necessary to insure that these clocks are in synchronization at any moment. For that purpose, check circuits are required to verify that the clock signals have not gradually shifted with respect to each other, whether there is a failure of one of the clocks, whether individual clock pulses are missing or whether there is an overall clock failure.

As a means of monitoring the individual clocks, the prior art has made use of simple logic circuits, such as AND gates, to which corresponding pulses of the various clocks are applied. One example of this type of clock monitoring means is shown by U.S. Pat. No. 3,600,690 to White.

In other cases, e.g.—in German Offenlegungssehrift No. 25 32 587, counters associated with the various clocks and comprising comparators are used to emit an error signal upon sensing an unequal count indicative of clock malfunction. German Auslegischrift No. 15 13 062 describes an arrangement wherein a multivibrator is impressed with the setting or resetting signals of two clocks. Upon the failure of a clock, the multivibrator stops and an associated capacitor is discharged to release an alarm signal.

However, these known clock checking arrangements are not suited for data processing and transmission systems, particularly modern computers having several synchronized clocks utilized therein. These clocks are part of the control circuitry of the computer, which is a complicated arrangement and therefore very difficult to examine for error conditions. It is necessary in connection with the malfunction checking of such circuitry that all errors appearing in the clocks themselves be fully detected and distinguished from other possible errors in the control circuitry. For that purpose, not only must the clock synchronism existing at any moment be checked, but also the dynamic behavior of the various clocks, i.e.—the relative position of time signals within a specific interval, needs to be verified.

Unfortunately, this cannot be done by simple logic gates. Furthermore, the checking device has to be able to detect the simultaneous stoppage of several clocks. This is not possible, either, through the use of simple logic gates and counters. In addition, the error indication has to take place immediately after the appearance of an error. Finally, another obvious demand is that the checking circuitry be easily realizable as a highly integrated circuit.

OBJECTS AND SUMMARY OF THE INVENTION

It is, therefore, an object of the present invention to provide a clock checking circuit for verifying the proper operation of synchronized clocks which overcomes the aforementioned prior art limitations and which satisfies the demands of modern computer systems.

This object is achieved by providing a circuit which utilizes combined logic gating signals derived from the various clocks, at least one of which signals is delayed by one or several clock periods, to enable a logic gate, the output of which sets an indicator latch. The indicator latch is periodically reset by an independent check clock.

In one embodiment of the present invention, the delay of the clock pulses is effected by flip-flops of the master-slave type which are set by the clock pulse to be delayed and reset by the independent check clock. In other embodiment, the clock pulse delay is achieved through the use of conventional delay circuits. The checking circuit can easily be expanded to accommodate a multitude of clocks; several logic gates with various combinations of delayed and undelayed clock pulses permit a flexible adaptation to the respective check requirements. The use of an independent check clock permits the detection of errors appearing simultaneously in all checked clocks.

This check circuit is of particular advantage in control clock pulse generators in microprogrammed systems whose microinstructions have different periods of execution. It can easily be expanded to the necessary number of clock pulses and permits uncomplicated checking of any short sequences of clock pulses.

DESCRIPTION OF THE PREFERRED EMBODIMENTS

Figure 1A:
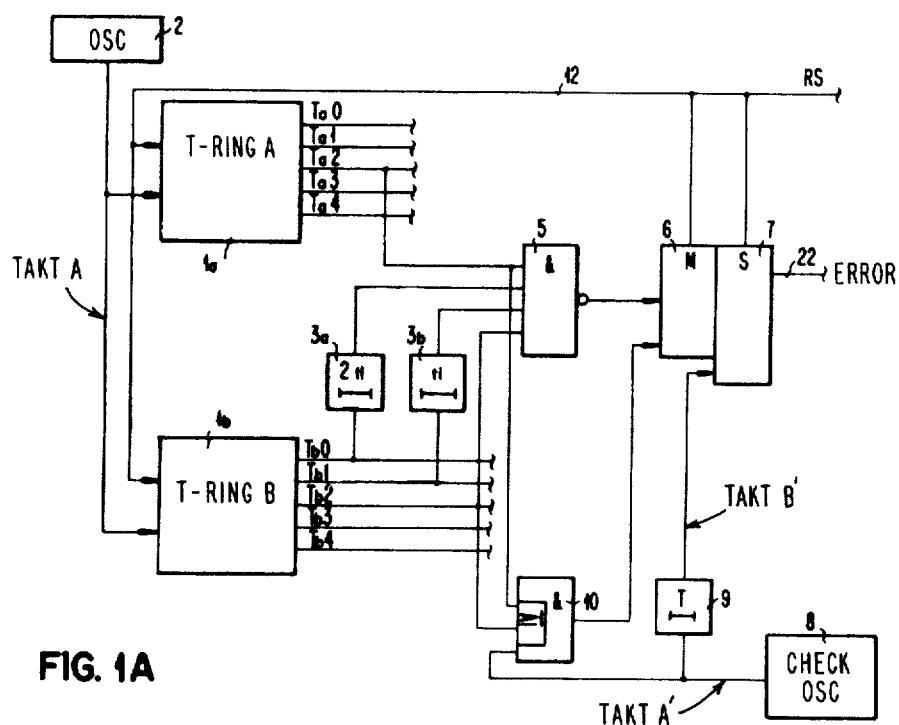
FIG. 1A depicts a schematic representation of one embodiment of the present invention.

In FIG. 1A, two clocks 1a and 1b, designated as T-rings A and B, respectively, are shown which respectively produce on their output lines, one time signal T0 to T4, which is repeated cyclically. As used herein, each of the signals T0 to T4 is considered to constitute one period of a clock cycle. The last time period signal of a repeated sequence (here T4) is also called TL. These time signals are derived from an oscillator signal TAKT A. Oscillator 2 generally comprises a pulse forming network arranged in series. T-rings 1a and 1b can consist, for example, of a rotating, fed back shift register with taps between the individual register stages at which time signals Ti are taken. In another embodiment, these T-rings can consist of continuously increased modulo counters, i.e.—in this example modulo four-counters. Instead of the T-rings with several output lines for one respective time signal, it is also possible to use a conventional oscillator circuit with only one output line on which a periodic output pulse train is given.

Figure 1B:
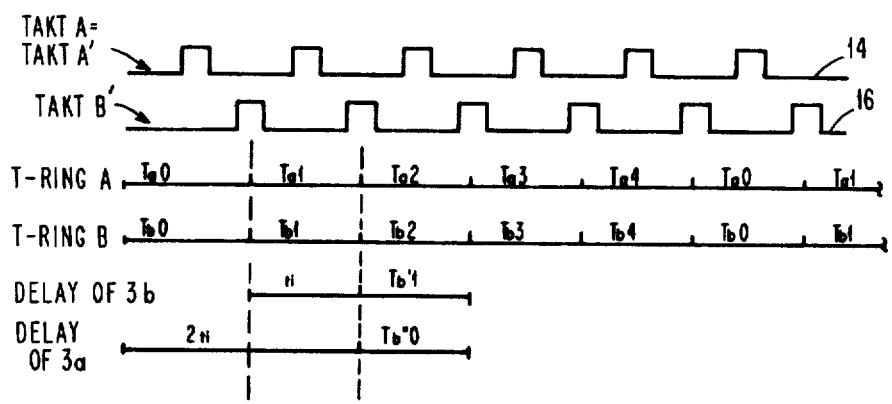
FIG. 1B shows a time-based diagram of the checked clocks of FIG. 1 and the relative positions of their output pulses with respect to time.

The pulse trains of the T-rings are shown in FIG. 1B. This figure also shows the relative position of the period signals Ti with respect to the oscillator signal TAKT A, identified by reference numeral 14 therein. Pulses TAKT A are respectively placed in the middle of time signals Ti.

For the functional test of the two T-rings 1a and 1b, which owing to the common oscillator signal are synchronized, an AND gate 5 is provided to which time signal Ta2 of T-ring A, and time signals Tb0, Tb1, and Tb2 of T-ring B are applied. Time signals Tb0 and Tb1 are delayed by delay elements 3a and 3b by a single or double period ti of time signals Ti. When the arrangement operates correctly, these signals therefore coincide with the time signals T2 of both T-rings. This case is represented in FIG. 1B.

In correct operations, therefore, the inverted output of AND gate 5 produces a negative signal with which flip-flop 6 of master-slave flip-flop 6, 7 is set. This flip-flop circuit is used as a display circuit for an error signal. For setting, the master part 6 also receives a signal, TAKT A', of a check oscillator 8. The transfer of the signal stored in master part 6 into slave part 7 takes place later by means of a signal TAKT B' produced through delay of ½ ti in device 9 of the signal TAKT A'. This signal TAKT B' is also shown in FIG. 1B and is identified therein by reference numberal 16. Thus, the output signal of slave part 7 indicates at that time, whether or not AND gate 5 has responded correctly. If there has been no error, there appears at the output of slave part 7, a signal with the logic value "0".

Check oscillator 8 operates with the same frequency as, and synchronously with, oscillator 2 (see FIG. 1B). If as in the above described embodiment, a check is performed only during time signal T2, the output signal of AND gate 5 must be stored during this time only since otherwise the unfulfilled condition in AND gate 5 would cause an error display even if the T-rings operate correctly. For selecting during time T2 the signal TAKT A' admissible for setting master part 6, a combinational logic circuit 10 is used by means of which the output signal of an OR gate included therein to which the input signals T2 of the two T-rings are applied is logically combined in a series-arranged AND gate with the signal TAKT A'. Alternatively, the frequency of check oscillator 8 can be reduced to such an extent that the oscillator emits a signal TAKT A' only at time T2. For resetting the T-rings and the master-slave flip-flop, e.g.—upon the switching on of the system, a resetting line RS 12 is used. The reset signal is generated by conventional means (not shown).

Figure 2:
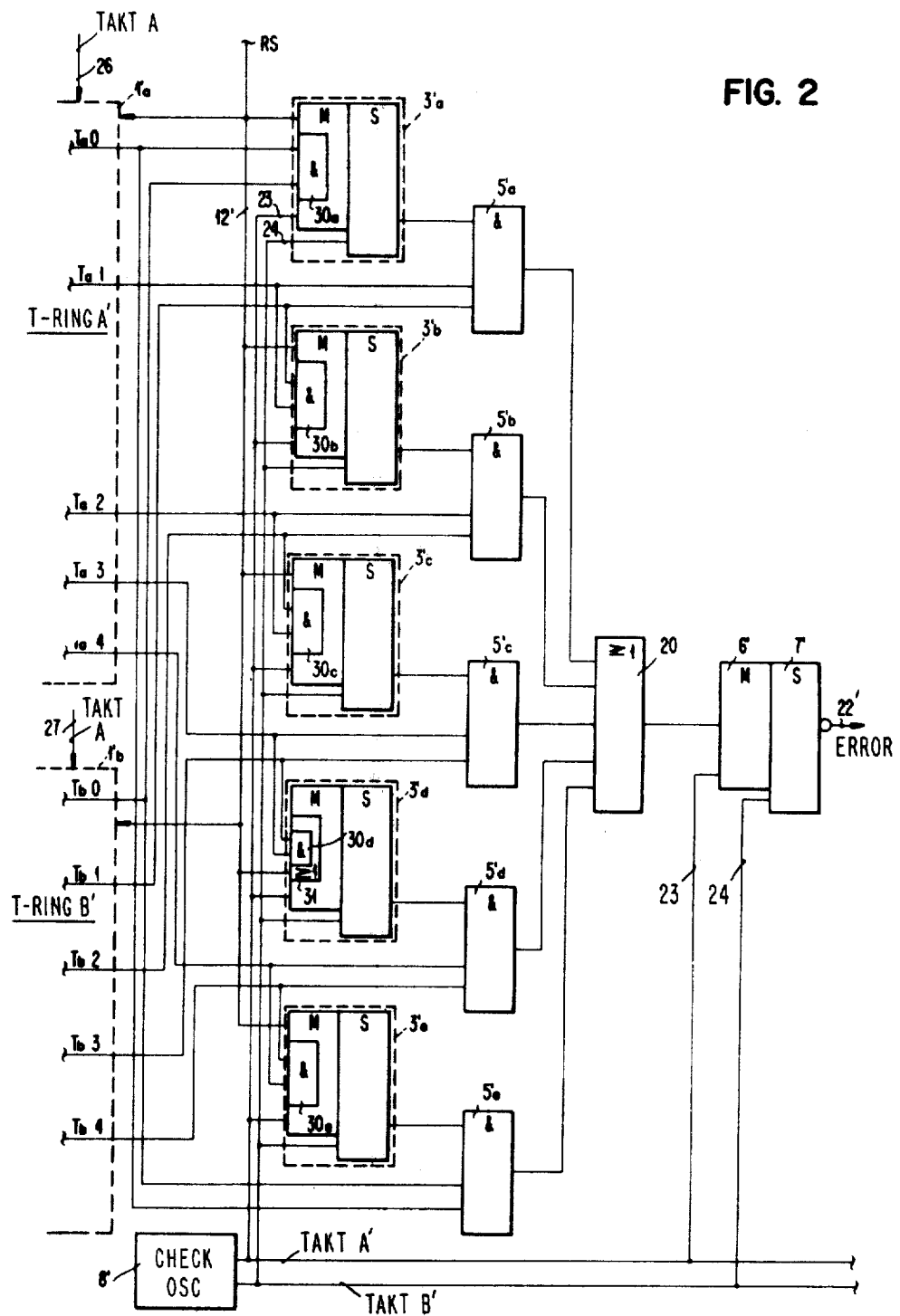
FIG. 2 illustrates schematically a second embodiment of the present invention comprising the basic circuit diagram of a clock checking arrangement with several logic combinations of the clocked pulses.

A complete check circuit for monitoring all time period signals T0 to T4 of the clocks 1'a and 1'b, respectively, is shown in FIG. 2. In this figure, elements corresponding to those in FIG. 1 show the same reference numbers, but carry an additional apostrophe. In place of the FIG. 1 delay devices 3a and 3b, flip-flop circuits 3a' to 3e' of the master-slave type have been selected. These delay circuits are set at times (i.e.—they take over the signals at their inputs) which are determined by the clock pulses of an independent check oscillator 8'. At the time 3a' to 3e', the master part is set by time signal TAKT A' via line 23 to that value which is determined by the input signals. There input signals are two respective coinciding time signals of the two T-rings A' and B' which are applied to the AND gates 30a to 30e, series-arranged, respectively, to the master part. Therefore, the information stored in the master part is only a logical "1" when both time signals Ti are present. At the time signal TAKT B' is applied to the slave part via line 24, the information stored in the master part reaches the slave part. The output signal of the slave part is only a logical "1" when both time signals had been present at the input of the master part. The delay of the master-slave flip-flops 3a' to 3e' is selected in such a manner that it corresponds exactly to duration ti of a time signal Ti. The output signal of the master-slave flip-flop is applied together with additional time signals of both T-rings to one of AND gates 5a' to 5e' which are directly series-arranged to the delay gates. AND gate 5a' thus logically combines, for example, the undelayed time signals Ta1 and Tb1 with time signals Ta0 and Tb0, delayed by one time unit. Only if all these signals are present simultaneously does there appear at AND gate 5a' a positive output signal which is applied to an OR gate 20. The output of OR gate 20 is connected to the input of another master-slave flip-flop 6', 7' (display flip-flop). The inverted output signal of this flip-flop, in turn, represents an error signal if it adopts a logic value of "1".

Master-slave flip-flop 6', 7' is set by the signals TAKT A' and TAKT B' determined by independent check oscillator 8'. The two oscillators 2' (not shown) and 8' operate with the same frequency and synchronously (compare FIG. 1B).

The AND-combination of time signals Ta1 and Tb1 is delayed in flip-flop 3'b and logically combined in AND gate 5'b with undelayed time signals Ta2 and Tb2. Elements 3'c and 5'c operate accordingly with time signals Ta2 and Tb2, Ta3 and Tb3. Signals Ta3 and Tb3 are delayed in flip-flop 3'd and logically combined in AND gate 5'd with the undelayed signals Ta4 and Tb4. In the given example, T4 is the last time signal within a cycle; the subsequent time signal is again T0. In flip-flop 3'e, therefore, time signals Ta4 and Tb4 are delayed and logically combined in AND gate 5'e with undelayed time signals Ta0 and Tb0.

OR gate 20 generates an error signal in flip-flop 6', 7' when any time condition within the cycle of time signals T0 to T4 has not been observed. The correct sequence of these time signals is thus fully checked by the circuit of FIG. 2. If the cycle of the time signal comprises more than time signals T0 to T4, the check circuit of FIG. 2 can be expanded by adding further gates 3' and 5'. If more than two clocks are to be checked, logic gates with a higher number of input lines are possible or other combinations of delayed and undelayed time signals can be selected.

In the time control of microprogrammed systems, some microinstructions do not require the entire cycle T0 to T4, but operate with less time units. If, to give an example, only three time units are required, each T-ring has to produce the sequence T0, T1, T4. The last time unit T4 is absolutely necessary as it controls necessary functions, for example, passing through end routines or reading out the operation code of the next instruction. To ensure correct operation of the check circuit of FIG. 2, also in a forced advance of the T-rings to time signal T4, flip-flops 3'a, 3'b, 3'c and 3'e have to be reset to a logical value "0", but flip-flop 3'd to logical value "1". This is done by means of a reset signal on line RS 12', generated by conventional means (not shown), which is applied only to flip-flop 3'd, i.e.—to the last but one within series 3'a to 3'e. at the set input via an OR gate 31 whose second input is the output signal of AND gate 30d, but to all other flip-flops at the reset input. It is thus made sure that upon the forcing of time signal T4, AND gate 5'd receives the undelayed time signals Ta4, Tb4 and the delayed (artificial) time signals Ta3 and Tb3. Without the forced setting of flip-flop 3'd, an error signal would appear on line 22 even in the absence of an error condition. In check circuits for T-rings with another number of time signals Ti, the respective delay device for the predecessors of the last time signal has to be set by the reset signal.

By using master-slave flip-flops as delay devices, it is possible to make the entire check circuit in an integrated structure and to provide it together with the T-rings on a semiconductor chip. The characteristics and parameters of all circuits on this chip are, therefore, optimally adapted to each other.

The control of the display flip-flop by an independent check oscillator ensures that even if there are errors in signal TAKT A, the position of master part 6 is interrogated and an error signal is given an output line 22. In a simplified embodiment, the signals TAKT A and TAKT A' can also be derived from the same oscillator, e.g. when this oscillator is highly error-proof.

While the present invention has been described in the context of a preferred embodiment thereof, it will be readily apparent to those skilled in the art, that modifications and variations can be made therein without departing from the spirit and scope of the present invention. Accordingly, it is not intended that the present invention be limited to the specifics of the foregoing description of the preferred embodiment, but rather as being limited only by the scope of the invention as defined in the claims appended hereto.

We claim:

1. In a data processing system having a plurality of synchronized clocks therein, each of the clock outputs having a predetermined number of period signals in each cycle of operation, apparatus for checking clock synchronization, said apparatus including:
   (a) logic circuit means for receiving the time-based periodic signals from the clocks and for generating an output signal indicative of proper clock synchronization in response thereto;
   (b) first circuit means connected between the clocks and said logic circuit means for applying a predetermined combination of the clock period signals to said logic circuit means; and
   (c) second circuit means connected between said first circuit means and said logic circuit means for delaying at least one of the clock period signals before it is applied to said logic circuit means.

2. The apparatus according to claim 1 wherein said second circuit means delays one or more of the clock period signals by one or more period intervals.

3. The apparatus according to claim 2 wherein said second circuit means includes one master-slave flip-flop for each period in the cycle of the clocks to be checked selectably used therein as a delay device for each of the clock period signals to be delayed.

4. The apparatus according to claim 2 which further includes independent oscillator circuit means, which runs at the same frequency as and synchronously with the system clocks being checked, for generating a set signal and an output signal, and wherein said logic circuit means comprises:
   (a) a first logic gate, connected to receive said predetermined combination of clock period signals, for generating a signal at its output in response thereto indicative of the simultaneous presence of the individual clock period pulses which constitute said predetermined combination;
   (b) a second logic gate, connected to receive certain of said clock period pulses in said predetermined combination thereof and said output signal of said independent oscillator circuit means, for generating an output signal in response to receipt of a predetermined logical combination of input signals; and
   (c) a master-slave flip-flop connected to receive said output signals of said first and second logic gates and said set signal from said independent oscillator circuit means, the output of which serves as verification of the systems' clocks synchronization.

5. The apparatus according to claim 4 wherein said predetermined combination of applied clock period signals includes, at least, a time period signal from a first clock to be checked, the corresponding undelayed period signal of a second clock to be checked and further delayed period signals of the second clock and wherein said independent oscillator circuit means includes means for supplying set pulses to said second logic gate only during the time signal period corresponding to that of the first clock period signal used in said predetermined combination.

6. The apparatus according to claim 5 which further includes circuit delay means connected between the set input of said master-slave flip-flop and the output of said independent oscillator circuit means.

7. The apparatus according to claim 6 wherein said second circuit means includes one master-slave flip-flop for each period in the cycle of the clocks to be checked selectably used therein as a delay device for each of the clock period signals to be delayed.

8. The apparatus according to claim 7 wherein each of said master-slave flip-flops are connected to and settable by said independent oscillator circuit means.

9. The apparatus according to claim 1 which further includes independent oscillator circuit means, which runs at the same frequency as and synchronously with the system clocks being checked, for generating a set signal and an output signal, and wherein said logic circuit means comprises:
   (a) a first logic gate, connected to receive said predetermined combination of clock period signals, for generating a signal at its output in response thereto indicative of the simultaneous presence of the individual clock period pulses which constitute said predetermined combination;
   (b) a second logic gate, connected to receive certain of said clock period pulses in said predetermined combination thereof and said output signal of said independent oscillator circuit means, for generating an output signal in response to receipt of a predetermined logical combination of input signals; and
   (c) a master-slave flip-flop connected to receive said output signals of said first and second logic gates and said set signal from said independent oscillator circuit means, the output of which serves as verification of the system's clocks synchronization.

10. The apparatus according to claim 9 wherein said second circuit means includes one master-slave flip-flop for each period in the cycle of the clocks to be checked selectably used therein as a delay device for each of the clock period signals to be delayed.

11. The apparatus according to claim 10 wherein each of said master-slave flip-flops are connected to and settable by said independent oscillator circuit means.

12. In a data processing system having a plurality of synchronized clocks therein, each of the clock outputs having a predetermined number of period signals in each cycle of operation, apparatus for checking clock synchronization, said apparatus including:
   (a) a logic circuit means for each period in the cycle of the clocks to be checked for receiving the time-based periodic signals from the clocks and for generating an output signal indicative of proper clock synchronization in response thereto;
   (b) first circuit means connected to the clocks for applying a predetermined combination of the clock period signals to each of said logic circuit means; and
   (c) a second circuit means for each period in the cycle of the clocks to be checked connected between said first circuit means and each of said logic circuit means for delaying at least one of the clock period signals in each of said predetermined combinations thereof before they are applied respectively to said logic circuit means.

13. The apparatus according to claim 12 wherein each of said second circuit means delays one or more of the clock period signals by one or more period intervals.

14. The apparatus according to claim 13 which further includes independent oscillator circuit means, which runs at the same frequency as and synchronously with the system clocks being checked, for generating an undelayed set signal and wherein said logic circuit means comprises:
   (a) a first logic gate, connected to receive said delayed and undelayed clock period signals of said predetermined combination, for generating a signal at its output in response thereto indicative of the simultaneous presence of the individual clock period pulses which constitute said predetermined combination; and
   (b) a master-slave flip-flop connected to receive said output signals of said first logic gates, said master portion thereof being connected to receive and be set by said undelayed set signal of said independent oscillator circuit means and said slave portion thereof being connected to receive and be set by said delayed set signal of said independent oscillator circuit means.

15. The apparatus according to claim 14 which further includes means for generating a reset signal and wherein each of each said second circuit means comprises a master-slave flip-flop having at least set and reset inputs and a logic gate associated therewith, each such logic gate being connected to receive the clock period signals which are to be delayed, each master portion of said flip-flops being connected to receive said undelayed set signal from said independent oscillator circuit means and each slave portion of said flip-flops being connected to receive said delayed set signal from said independent oscillator circuit means, all of said master portions of said flip-flops except the one corresponding to the penultimate clock period being operatively coupled to receive said reset signal at its reset input, said penultimate master portion only and its associated logic gate being connected to receive said reset signal at an input of said associated logic gate which is adapted to force the output of said penultimate flip-flop upon receipt of said reset signal to a logic state compatible with proper synchronous operation.

* * * * *